United States Patent
Perry

(10) Patent No.: US 6,877,140 B1
(45) Date of Patent: Apr. 5, 2005

(54) METHOD AND SYSTEM FOR GENERATING A SCHEMATIC REPRESENTING BUS STRUCTURES

(75) Inventor: Steven J. Perry, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 229 days.

(21) Appl. No.: 10/205,338

(22) Filed: Jul. 24, 2002

(51) Int. Cl.[7] .............................................. G06F 17/50
(52) U.S. Cl. ....................................................... 716/2
(58) Field of Search ................................... 716/1–3, 18

(56) References Cited

U.S. PATENT DOCUMENTS

| | | | | |
|---|---|---|---|---|
| 5,883,807 A | * | 3/1999 | Fanjoy | ........................... 716/8 |
| 6,493,648 B1 | * | 12/2002 | Anderson | .................... 702/119 |
| 6,574,787 B1 | * | 6/2003 | Anderson | ..................... 716/18 |

OTHER PUBLICATIONS

Stephen T. Frezza, Steven P. Levitan; "SPAR: A Schematic Place and Route System"; IEEE Transactions on Computer–Aided Design of Integrated Circuits and Systems, vol. 12, No. 7; Jul. 1993; pp. 956–973.

* cited by examiner

Primary Examiner—Stacy A. Whitmore
(74) Attorney, Agent, or Firm—Pablo Meles; Bernard Hoffman

(57) ABSTRACT

A method (300) of generating a simplified netlist using bus information includes the steps of identifying (302) nets that form buses in a netlist and identifying (304) instances of a same type that connect to the identified nets via pins of the same name to form at least one set of instances. The method further includes the step of replacing (308) at least one set of instances with at least a single arrayed instance if each net in a bus is connected to exactly one of the same type of instance via a pin of the same name and the step of deleting the nets forming the arrayed instance from the netlist and replacing (314) the nets with a corresponding bus.

18 Claims, 3 Drawing Sheets

100

METHOD AND SYSTEM FOR GENERATING A SCHEMATIC REPRESENTING BUS STRUCTURES

FIELD OF THE INVENTION

This invention relates generally to methods of generating a schematic of a circuit, and more particularly to a method and system for generating a schematic of a circuit using bus information.

BACKGROUND OF THE INVENTION

Computer aided design (CAD) systems for the design of electronic circuits assist in the design of electronic circuits by providing a user with a set of software tools running on a digital computer with a graphical display device. Typically, several software programs including a schematic editor, a logic compiler, a logic simulator, a logic verifier, and a layout program form a CAD system. The schematic editor program allows the user of the system to enter and/or modify a schematic diagram using the display screen, generating a net list in the process. The logic compiler takes the net list as an input, and using a component database puts all of the information necessary for layout, verification and simulation into a netlist object file or files whose format can be optimized specifically for those functions. The logic verifier checks the netlist for design errors, such as multiple outputs connected together, overloaded signal paths, etc., and generates error indications if problems exist. The logic simulator takes the netlist object file or files and simulation models, and generates a set of simulation results, acting on instructions initial conditions and input signal values provided to it either in the form of a file or user input. The layout program generates data from which a semiconductor chip or a circuit board may be laid out and produced.

Electrical engineers can use a Hardware Description Language (HDL) to specify an electrical circuit. They use special synthesis programs to produce a netlist description of that circuit. It is often useful for them to look at a graphical representation of the intermediate or final product of the synthesis program. The intermediate form of the data is often referred to as an RTL (Register Transfer Logic) description of the design. The final form is often referred to as a Technology description of the design. The present invention applies to both descriptions of the design. Engineers typically write the HDL description in terms of single nets, and groups of nets, known as buses. The synthesis process typically results in an RTL and Technology description only in terms of single nets where no buses are used. The resultant diagrams or schematics using single nets are typically complicated and difficult to follow for most users. Furthermore, a schematic using single nets makes it more difficult for a user to determine if the synthesis tool operated properly. The analysis in understanding the critical timing paths of a particular design or circuit performance based on simulation or implementation data is likewise further complicated. Thus, a need exists for a method for generating simplified netlists and schematics utilizing bus information.

SUMMARY OF THE INVENTION

If a schematic generation tool can determine some set of nets in a netlist that ought to be grouped together in a bus, the resulting schematic will be much simpler to read and understand. Moreover and more importantly, it is possible to use the bus information to find groups of instances that can be grouped together into a single "arrayed instance". From these arrayed instances, it is possible to find more nets that can be grouped into buses, which leads to more arrayed instances. The steps of finding groups of instances and finding more nets that can be grouped into buses can be repeated until no more buses are created. The resulting generated schematic or netlist can be much simpler than a schematic where this bus information is not used, and the result is that it is more intelligible to the user. The user can examine the resulting schematic to determine if the synthesis tool has properly done its job, and/or to help understand the critical timing path through his design and/or to examine circuit performance (timing) based on simulation or implementation data.

In a first aspect of the present invention, a method of generating a schematic illustrating bus structures comprises the steps of finding nets that can be grouped into nets. This could be done on the basis of the names of the nets, or by propagating bus information from HDL source information to a netlist description using a synthesis program, annotating each of the nets in the plurality of nets with a bus name and index to create a simplified netlist, and generating a simplified schematic using the simplified netlist.

In a second aspect of the present invention, a method of generating a schematic illustrating bus structures comprises the steps of providing an indicia of a group of nets in the form of a bus name and an index generated by a synthesis program to illustrate bus information, utilizing the bus information to find groups of instances that can be grouped into a single arrayed instance, and generating a simplified schematic illustrating the arrayed instances.

In a third aspect of the present invention, a method of generating a simplified netlist using bus information comprises the steps of identifying nets that form buses in a netlist and identifying instances of a same type that connect to the identified nets via pins of the same name to form at least one set of instances. The method further comprises the steps of replacing at least one set of instances with at least a single arrayed instance if each net in a bus is connected to exactly one of the same type of instance via a pin of the same name and the step of deleting the nets forming the arrayed instance from the netlist and replacing the nets with a corresponding bus.

DETAILED DESCRIPTION OF THE DRAWINGS

The present invention uses bus information in a netlist generated from synthesis programs to find nets that can be grouped into buses, and to find instances that can be grouped together into "arrayed instances" (sort of a bus of instances). The netlist is examined starting at well-defined points to find buses. The buses are then used to find arrayed instances. The arrayed instances can be used to find more buses, and so on. The resulting generated schematic diagram is much simpler and easier to understand than if this information and process is not used.

Figure 1:
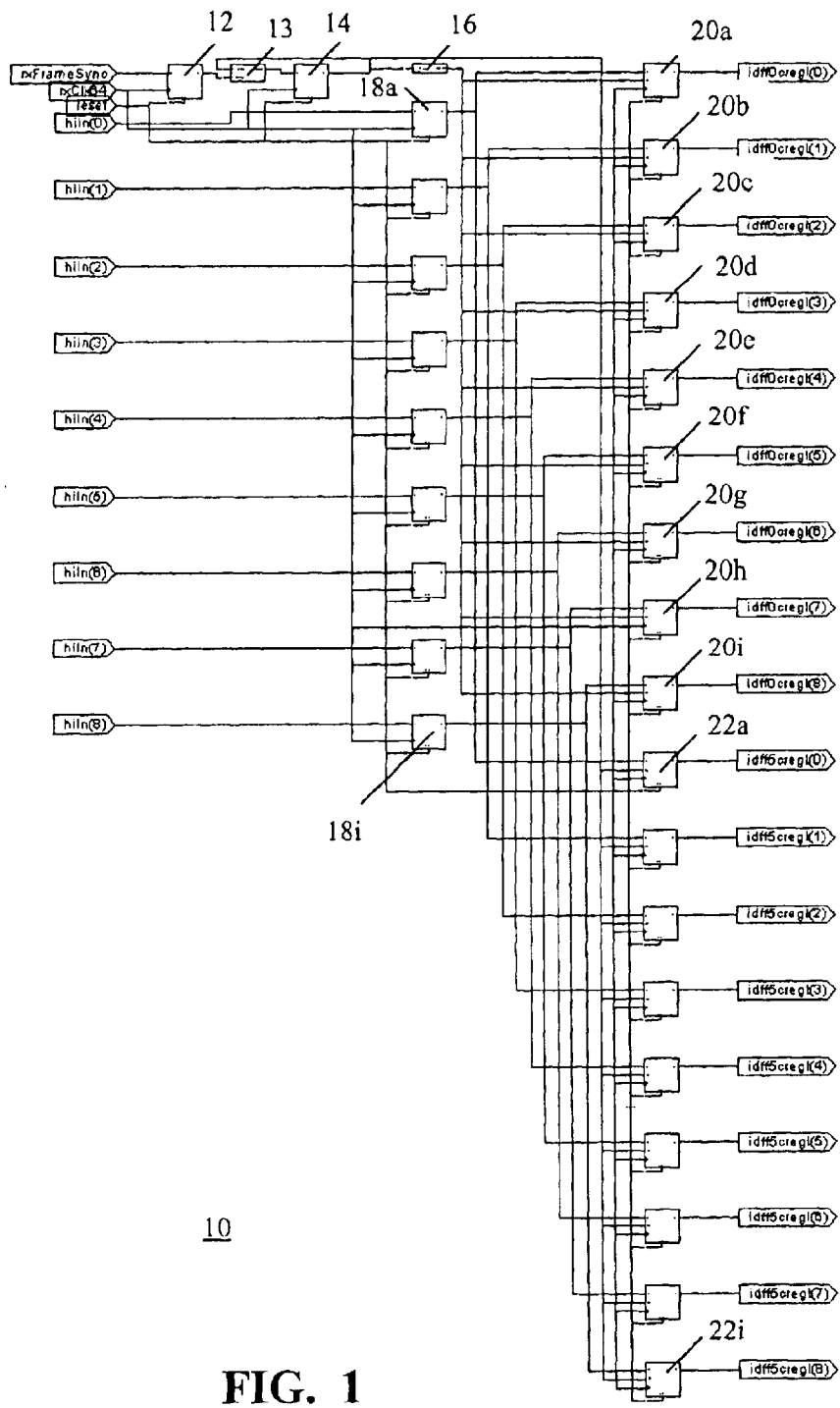
FIG. 1 is a schematic diagram generated without bus information.
Figure 2:
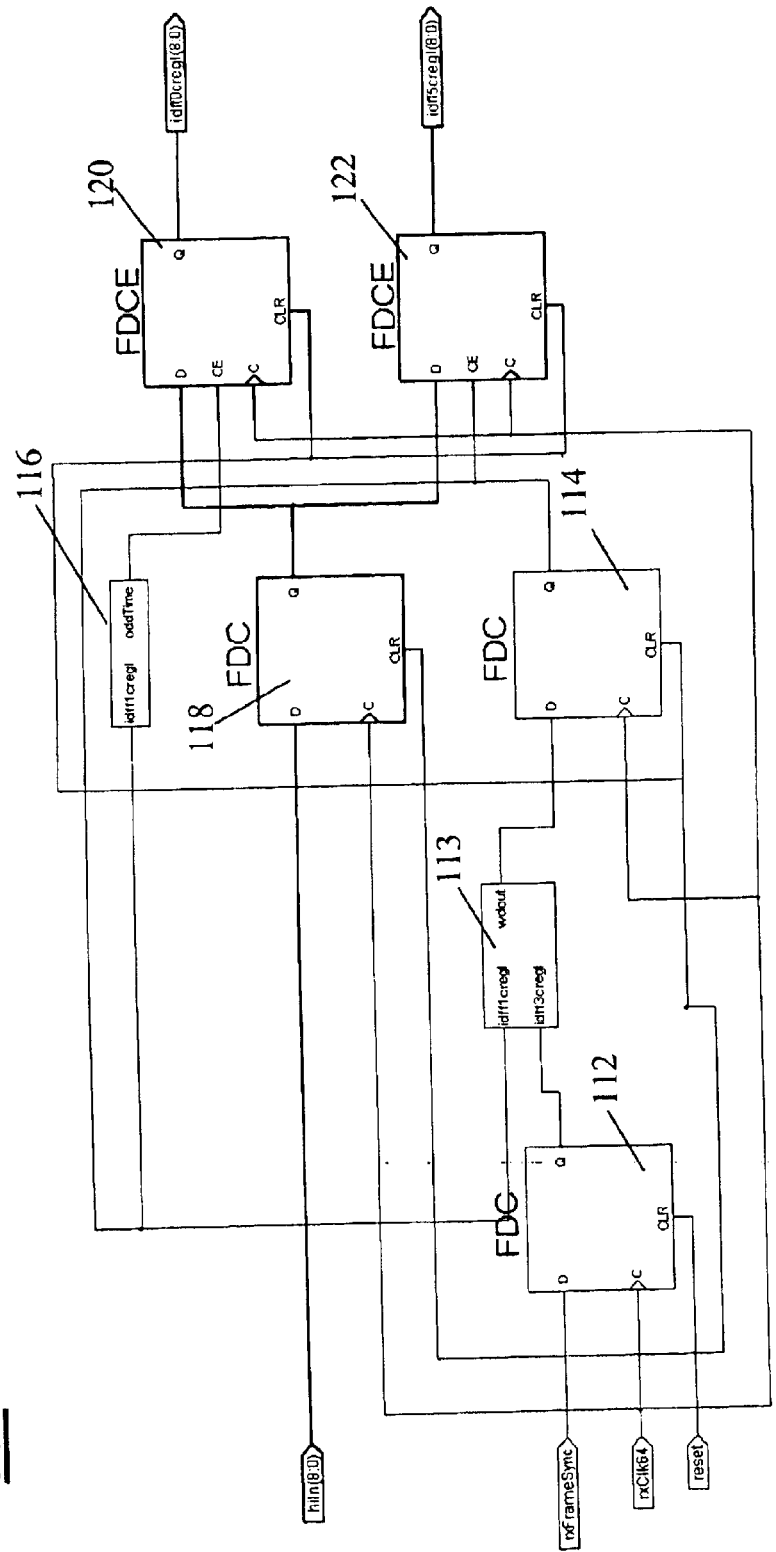
FIG. 2 is a schematic diagram generated with bus information in accordance with the inventive arrangements.

Referring to FIG. 1, a schematic 10 is generated without the use of bus information. The schematic 10 includes illustrations of flip flops 12, 14, 18a–18i, 20a–20i, and 22a–22i as well as devices 13 and 16. Referring to FIG. 2, a schematic 100 is generated with the use of bus information. The schematic 100 includes illustrations of flip flops 112, 114, 118, 120, and 122 as well as devices 113 and 116. Note that the number of instances and wires that represent nets and buses is greatly reduced in FIG. 2 when compared to FIG. 1.

The process used to recover and use the bus information starts with the bus information that is propagated from the HDL source code to the netlist by a synthesis program. The synthesis program annotates each net that came from a bus with the bus name and the index in the bus where that signal can be found. For example, a bus named "data(31:0)" will typically give rise to 32 nets named something like data_31, data_30 . . . data_0. The synthesis program adds two properties to each net. The first property, here named "SIG_BUSNAME," contains the name of the source bus. The second, here named "SIG_BUSIDX," gives the index in the bus from which the net is derived. In the example, above, net data_1 would have a SIG_BUSNAME property with a value of "data(31:0)", and a SIG_BUSIDX value of 31.

Some of the instances in the netlist contain pins that were derived from "bus pins"—i.e., pins that connect to a bus. The synthesis program also annotates the pins of instances with similar information. For example, if a bus named IN(7:0) were connected to an instance of an ADDER type block via a bus pin named "A(7:0)", the netlist would have and adder instance with pins named something like A_7, A_6. A_0. Each pin would have two properties, PIN_BUSNAME and PIN_BUSIDX, that indicate the bus pin they were derived from and the index in that pin. In the example, above, pin A_7 would have a property PIN_BUSNAME with a value "A(7:0)", and a PIN_BUSIDX property with a value of 0.

The process for using this bus information to create a simpler schematic starts by creating a simplified netlist in which multiple nets and instances are replaced by buses and arrayed instances. The simplified netlist is then used by the schematic place and route functions in place of the original input netlist. No modifications are needed to the schematic place and route functions.

Figure 3:
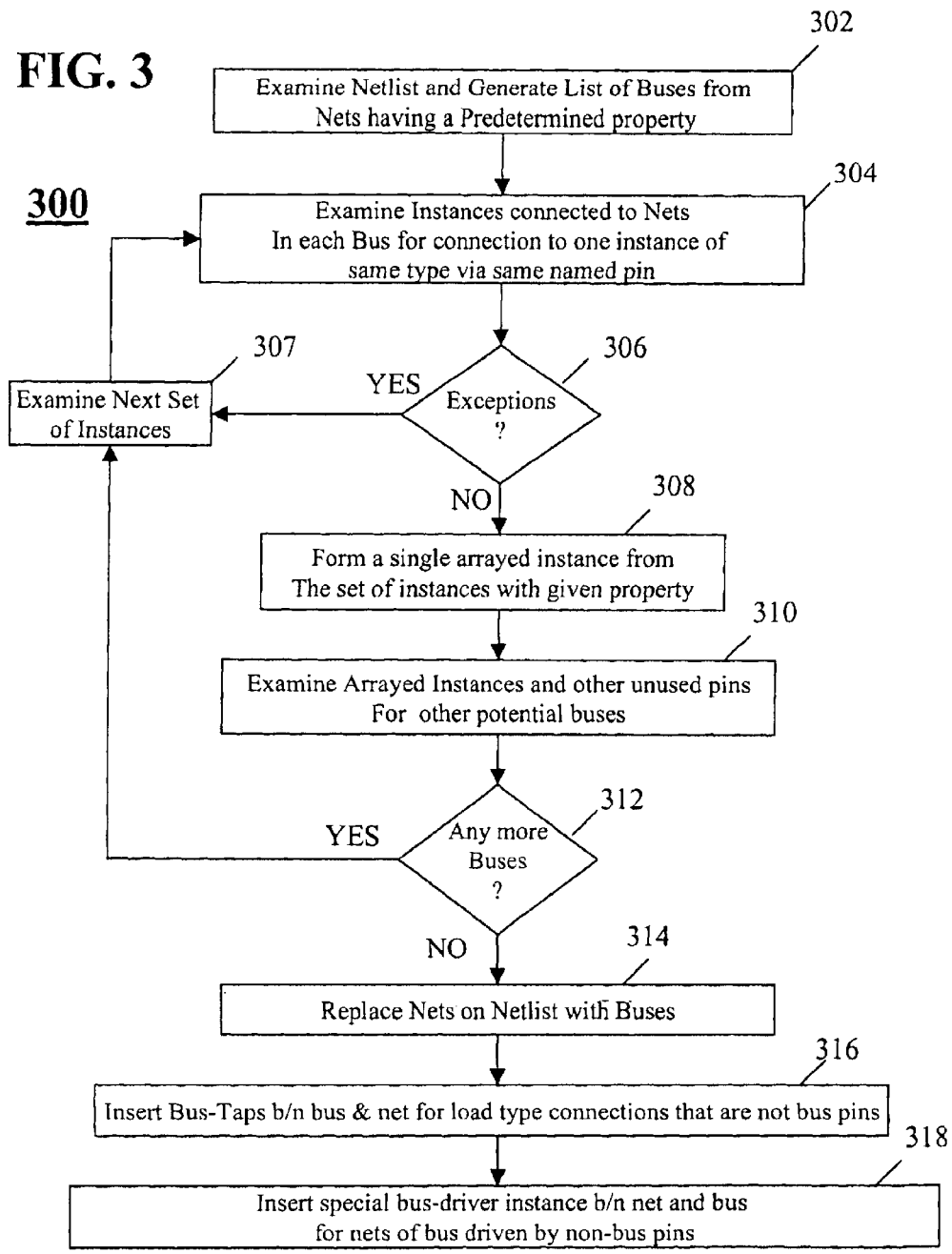
FIG. 3 is a flow chart illustrating a method in accordance with the present invention.

The method 300 of creating a simplified netlist and schematic in accordance with the present invention proceeds as described with respect to FIG. 3. If the netlist is hierarchical, the name of the block and the contents of which will be used to generate the schematic is known as the "parent block." At step 302, the method examines the netlist and creates a list of buses. Preferably, the list of buses are created from the following: (a) the nets that have the SIG_BUSNAME and SIG_BUSIDX properties, and (b) the nets that connect to the pins of the parent block that have the PIN_BUSNAME and PIN_BUSIDX properties; and (c) the nets that connect to the pins of instances in the netlist that have the PIN_BUSNAME and PIN_BUSIDX properties. Alternatively, the buses can be grouped and subsequently created by using a more general method. One such method would use the names of the nets and instances themselves. For example, if there are nets named data 1, data 2, data 3, and data 4, they could be used to form a bus "data(1:4)".

Each bus consists of an array of nets that are members of the bus, with each net at the index in the array as given by the SIG_BUSIDX or PIN_BUSIDX property value. Each bus also has a name that is either the name of the bus, as given by the SIG_BUSNAME or PIN_BUSNAME property, or a concatenation of all the net names separated by some delimiter such as a comma (the reason for this method of nomenclature will become apparent below).

Next, at step 304, the instances that are connected to nets of each bus are examined. Instances of the same type of block (i.e., instances of an AND2 type block) that connect to the nets via pins with the same name (i.e., the pin named "0") are found. After examining and collecting the instance information, if each net in the bus is connected to exactly one of the same type of instance via the same-named pin, and there are no issues that prohibit the instances from becoming part of an arrayed instance at step 306, then those set of instances can be replaced by a single arrayed instance at step 308. There are several conditions that can keep an instance from becoming an arrayed instance. For example, if one of the other pins is a bus pin—it has the PIN_BUSNAME and PIN_BUSIDX properties; or if the instance connects to a net that is connected to a pin on the parent block that is not a bus pin. If such exceptions exist, then other sets of instance can be examined to see if a bus may be formed at step 307. Each arrayed instance consists of an array of instances that are its members. The instance at each index has a connection to a net at the same index in the bus or buses that it connects to. The arrayed instance has a name that is formed by concatenating the names of the instances separated by a delimiter such as a comma.

Next, at step 310, the arrayed instances found in step 308 are examined as well as the pins that were not used to form the arrayed instance in step 308. These nets that connect to these pins can be organized by the pin name and by the index of the instance in the arrayed instance to form a potential bus. If the nets of this potential are not all the same, and if none of the nets are part of a bus, then the potential bus may used to create a new bus. The nets in this bus need not have the SIG_BUSNAME and SIG_BUSIDX properties, and their names may be totally unrelated to each other. The bus name is formed by concatenating the names of the individual nets, separated by some delimiter such as a comma.

Steps 304 through 310 are repeated until no new buses are formed as indicated by decision block 312. Then, at step 314, the nets that form buses can replace nets on the netlist with buses. More specifically, the connections of the nets that are part of the buses are examined. If the source pin of the bus comes from a single bus pin (on a single instance) or from a set of same-named pins of an arrayed instance, and if all of the source load type connections to instances are done via the bus, then the net can be deleted from the netlist and replaced by the bus. At step 316, if any of the nets have load type connections that are not bus pins, then instances of a special type of block, known as "bus-taps," must be inserted between the bus and the net, where the bus drives the input pin of the bus-tap, the output of the bus-tap drives the net. If the nets of a bus are driven by non-bus pins at step 318, then a special bus-driver instance must be inserted between those nets and the bus, where the nets drive the input pins of the bus-driver and the output of the bus-driver drives the bus.

The present invention can also be embedded in a computer program product, which comprises all the features enabling the implementation of the methods described herein, and which, when loaded in a computer system, is able to carry out these methods. Computer program or application in the present context means any expression, in any language, code or notation, of a set of instructions intended to cause a system having an information processing capability to perform a particular function either directly or after either or both of the following a) conversion to another language, code or notation; b) reproduction in a different material form.

The embodiments and system described above should give a circuit designer greater ease in designing electronics circuits. The simplified netlists and schematics in accordance with the present invention will make the analysis of critical timing paths and circuit performance of a particular design based on simulation or implementation data much clearer.

Additionally, the description above is intended by way of example only and is not intended to limit the present invention in any way, except as set forth in the following claims.

What is claimed is:

1. A method of generating a schematic illustrating bus structures, comprising the steps of:

propagating bus information from HDL source information to a netlist description using a synthesis program, wherein bus information includes a plurality of nets;

annotating each of the nets in the plurality of nets with a bus name and index to create a simplified netlist; and generate a simplified schematic using the simplified netlist.

2. The method of claim 1, wherein the method further comprises the step of taking instances of the plurality of nets and collapsing the instances into a single arrayed instance.

3. The method of claim 2, wherein the method further comprises the step of using the single arrayed instance to find other plurality of nets that can be grouped into at least one bus.

4. A method of generating a schematic illustrating bus structures, comprising the steps of:

providing an indicia of a group of nets in the form of a bus name and an index generated by a synthesis program to illustrate bus information;

utilizing the bus information to find groups of instances that can be grouped into a single arrayed instance; and generating a simplified schematic illustrating the single arrayed instances.

5. The method of claim 4, wherein the method further comprises the step of using the instances of the plurality of nets and the single arrayed instance to find other plurality of nets that can be grouped into at least one bus.

6. A method of generating a simplified netlist using bus information, comprising the steps of:

identify nets that form buses in a netlist;

identify instances of a same type that connect to the identified nets via pins of the same name to form at least one set of instances;

replacing the at least one set of instances with at least a single arrayed instance if each net in a bus is connected to exactly one of the same type of instance via a pin of the same name; and deleting the nets forming the arrayed instance from the netlist and replacing the nets with a corresponding bus.

7. The method of claim 6, wherein the step of identifying nets comprises the steps of identifying nets that have parent block properties, nets that connect to pins having parent block properties, and nets that connect to the pins of instances that have the parent block properties.

8. The method of claim 6, wherein the method further comprises the step of preventing the replacement of a set of instances with a single arrayed instance when one of the pins is a bus pin or when the instance connects to a net that is connected to a pin on the parent block that is not a bus pin.

9. The method of claim 6, wherein the arrayed instance has a name that is formed by concatenating the names of the instance separated by a delimiter.

10. The method of claim 6, wherein the method further comprises the step of identifying other potential buses from pins not used to form the single arrayed instance and forming a name for a potential bus by concatenating the names of the individual nets separated by a delimiter.

11. The method of claim 6, wherein the step of deleting the nets only occurs if a source pin of the bus comes from a single bus pin on a single instance or from a set of same-named pins of an arrayed instance and if all of the source load type connections to instances are done via the bus.

12. The method of claim 11, wherein bus-taps must be inserted between the bus and the net if any of the nets in the bus have load type connections that are not bus pins, wherein the bus drives the input pin of the bus tap and the net is driven by the output of the bus tap.

13. The method of claim 11, wherein a special bus-driver instance must be inserted between the nets of buses driven by non-bus pins and the bus, wherein the nets drive the input pins of the bus-driver and the output of the bus-driver drives the bus.

14. A method of generating a schematic illustrating bus structures, comprising the steps of:

identifying a plurality of related nets that can form a bus;

collapsing the related nets into a single bus to create a simplified netlist; and generating a schematic using the simplified netlist.

15. The method of claim 14, wherein the related nets are instances and the single bus is an arrayed instance.

16. The method of claim 15, wherein the method further comprises the step of propagating bus information from HDL source information to a netlist description using a synthesis program, wherein bus information includes the plurality of related nets.

17. The method of claim 16, wherein the method further comprises the step of annotating each of the nets in the plurality of related nets with a bus name and index to create the simplified netlist.

18. The method of claim 14, wherein the step of identifying a plurality of related nets comprises the step of identifying common names used for nets and instances to form the bus.

* * * * *